United States Patent
Gao et al.

(10) Patent No.: US 7,425,871 B2
(45) Date of Patent: Sep. 16, 2008

(54) COMPENSATION UNITS FOR REDUCING THE EFFECTS OF SELF-HEATING AND INCREASING LINEAR PERFORMANCE IN BIPOLAR TRANSISTORS

(75) Inventors: Huai Gao, Irvine, CA (US); Haitao Zhang, Irvine, CA (US); Huinan Guan, Irvine, CA (US); Guann-Pyng Li, Irvine, CA (US)

(73) Assignee: Regents of the University of California, Oakland, CA (US)

( * ) Notice: Subject to any disclaimer, the term of this patent is extended or adjusted under 35 U.S.C. 154(b) by 103 days.

(21) Appl. No.: 11/087,068

(22) Filed: Mar. 21, 2005

(65) Prior Publication Data

US 2005/0225395 A1    Oct. 13, 2005

Related U.S. Application Data

(60) Provisional application No. 60/621,482, filed on Oct. 22, 2004, provisional application No. 60/554,875, filed on Mar. 19, 2004.

(51) Int. Cl.
*H03F 1/30* (2006.01)
(52) U.S. Cl. .................... 330/289; 330/290
(58) Field of Classification Search ........... 330/290, 330/289
See application file for complete search history.

(56) References Cited

U.S. PATENT DOCUMENTS 5,268,649 A * 12/1993 Jones ..................... 330/296
6,333,677 B1 * 12/2001 Dening ................... 330/296
6,369,657 B2 * 4/2002 Dening et al. ............ 330/296
6,922,107 B1 * 7/2005 Green .................... 330/296

OTHER PUBLICATIONS

Huai Gao et al., "*A Compact Composite Transistor as a Novel RF Power Cell for High Linearity Power Amplifiers*," IEEE Microwave and Optical Technology Letters, Jun. 20, 2005, pp. 483-485.
Huai Gao et al., "*A Novel Compact Composite Power Cell for High Linearity Power Amplifiers in InGaP HBTs*," 2004 IEEE Compound Semiconductor IC Digest, 2004, pp. 45-48.
F.M. Ghannouchi et al., "*An Adaptive Linearizer Using Feedback and Dynamic Biasing Techniques for SSPAs*", Microwave and Optoelectronics Conference, SBMO/IEEE MTT-S International, vol. 1, Jul. 24-27, 1995, pp. 369-372.

(Continued)

*Primary Examiner*—Robert J. Pascal
*Assistant Examiner*—Alan Wong
(74) *Attorney, Agent, or Firm*—Orrick, Herrington & Sutcliffe LLP

(57) ABSTRACT

The systems and methods described herein provide for composite transistor circuit having a bipolar transistor and a compensation unit. The compensation unit can be configured to stabilize the DC biasing point of the bipolar transistor. The compensation unit can compensate for the self-heating effect in the bipolar transistor and/or improve the linear performance of the bipolar transistor. The compensation unit can include a nonlinear resistor in series with a switch and can be configured to increase the base current into the bipolar transistor as the output voltage of the circuit increases.

4 Claims, 16 Drawing Sheets

OTHER PUBLICATIONS

R. Dettmer, et al., "*Effect of Device Layout on the Thermal Resistance of High-Power Thermally-Shunted Heterojunction Biopolar Transistors*", IEEE MTT-S International Microwave Symposium Digest, 1996, vol. 3, Jun. 17-21, 1996, pp. 1607-1610.

D. Hill et al., "*Novel HBT with Reduced Thermal Impedance*", IEEE Microwave and Guided Wave Letters, vol. 5, Issue 11, Nov. 1995, pp. 373-375.

H. Seidel, "*A Microwave Feedforward Experiment*", Bell system Technical Journal, Nov. 1971, pp. 2879-2916.

T. J. Bennet, et al., "*Feedforward - An Alternative Approach to Amplifier Linearisation*", Radio and Electronic Engineer, May 1974.

C. L. Larose et al., "*Optimization of Feedforward Amplifier Power Efficiency on the Basis of Drive Statistics*", Microwave Theory and Techniques, IEEE Transaction, vol. 51, Issue 1, Jan. 2003, pp. 41-54.

N. Naskas et al., "*A New Non-iterative, Adaptive Baseband Predistortion Method for High Power RF Amplifiers*", Circuits and Systems, 2003. ISCAS 2003 Proceedings of the 2003 International Symposium, vol. 1, May 25-28, 2003, pp. 413-416.

\* cited by examiner

COMPENSATION UNITS FOR REDUCING THE EFFECTS OF SELF-HEATING AND INCREASING LINEAR PERFORMANCE IN BIPOLAR TRANSISTORS

CROSS-REFERENCE TO RELATED APPLICATIONS

This application claims priority to U.S. provisional application Ser. No. 60/554,875, filed Mar. 19, 2004 and U.S. provisional application Ser. No. 60/621,482, filed Oct. 22, 2004, both of which are fully incorporated herein by reference.

FIELD OF THE INVENTION

The present invention relates to the use of a compensation unit with a bipolar device to reduce the effects of self-heating and/or increase the linear performance of a bipolar transistor.

BACKGROUND INFORMATION

Bipolar transistors are key components in high output power density circuits that operate at microwave frequencies. These circuits commonly employ heterojunction bipolar transistors (HBTs) and are increasingly being utilized in large signal applications, such as power amplifiers, oscillators, mixers, modulators, high speed circuits and the like. These large signal applications can create high power densities within the HBT that can lead to significant temperature increases. Although temperature sensitivity is significant for all types of power transistors, it is particularly important for the HBT when fabricated in processes having relatively poor thermal conductivity and a strong dependence of junction behavior on temperature, such as Gallium Arsenide (GaAs)-based processes, Indium Phosphate (InP)-based processes and Gallium Nitride GaAs and the like.

When an HBT operates with high current densities, typically greater than 10 kiloamps per square centimeter (kA/cm$^2$), a commonly observed phenomenon referred to as the self-heating effect occurs. The self-heating effect is characterized by a decreasing current gain with increasing output voltage. The mechanisms responsible for the self-heating effect are generally attributed to a variation in current gain with junction temperature and are the same as those giving rise to the variation of gain with ambient temperature. Thus, as the output voltage of the HBT increases (typically the voltage between the collector and the emitter $V_{CE}$), the self-heating effect causes the current gain to decrease. This phenomenon is depicted in FIG. 1A, which is a graph of output current density versus output voltage for a conventional HBT transistor in a common emitter configuration. An exemplary load line region 100 for the HBT is also shown. Here, it can be seen that the output current density decreases, or rolls off, as the output voltage increases, generally with greater severity as the base current increases. This, in turn, decreases the gain ($\beta$) and leads to DC biasing point and DC quiescent point destabilization on the load line 100 for large signal designs. A graph of output current density versus output voltage for an ideal HBT transistor is depicted in FIG. 1B. Here, the output current density remains constant as the output voltage increases, resulting in a stable DC quiescent point.

One reason HBTs are commonly used is because they have highly efficient power operation at microwave frequencies. However, most applications, such as power amplifier (PA) applications in a communication system, need to have both high efficiency and high linearity. For instance, PA nonlinearity leads to intermodulation distortion and can raise the bit error rate (BER) and, accordingly, is one of the key issues in microwave communication systems. As a consequence, the linearity of the circuit is a major factor in large signal circuit design.

To date, efforts to alleviate the self-heating effect can be classified as semiconductor processing techniques or circuit design topology techniques, both of which have distinct disadvantages. The processing techniques typically increase the processing complexity and lead to lower yield, while the circuit techniques typically result in significant increases in chip area and design complexity.

Thus, improved systems and methods that compensate for the self-heating effect of HBTs and/or improve HBT linearity are needed.

SUMMARY

The systems and methods described herein provide for a composite transistor circuit. In one exemplary embodiment, which is described below as an example only and not to limit the invention, the composite transistor circuit includes a bipolar transistor having a base, an emitter and a collector and a compensation unit coupled with the bipolar transistor and configured to stabilize the DC biasing point of the bipolar transistor. The circuit is preferably used in large signal applications and is configured to compensate for the self-heating effect and/or improve the linear performance over conventional circuits. The compensation unit can be coupled between the base and emitter and can include, or be modeled as, a nonlinear resistor in series with a switch. The compensation unit can be configured to increase the base current input to the bipolar transistor as the output voltage of the circuit increases to compensate for the self heating effect and improve the linear performance of the bipolar transistor and stabilize the DC biasing point of the bipolar transistor. In another embodiment, the compensation unit can be coupled between the base and collector of the bipolar transistor and configured to improve the linear performance of the bipolar transistor and stabilize the DC biasing point of the bipolar transistor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to require the details of the example embodiments.

BRIEF DESCRIPTION OF THE FIGURES

The details of the invention, including fabrication, structure and operation, may be gleaned in part by study of the accompanying figures, in which like reference numerals refer to like segments.

DETAILED DESCRIPTION

Figure 2A:
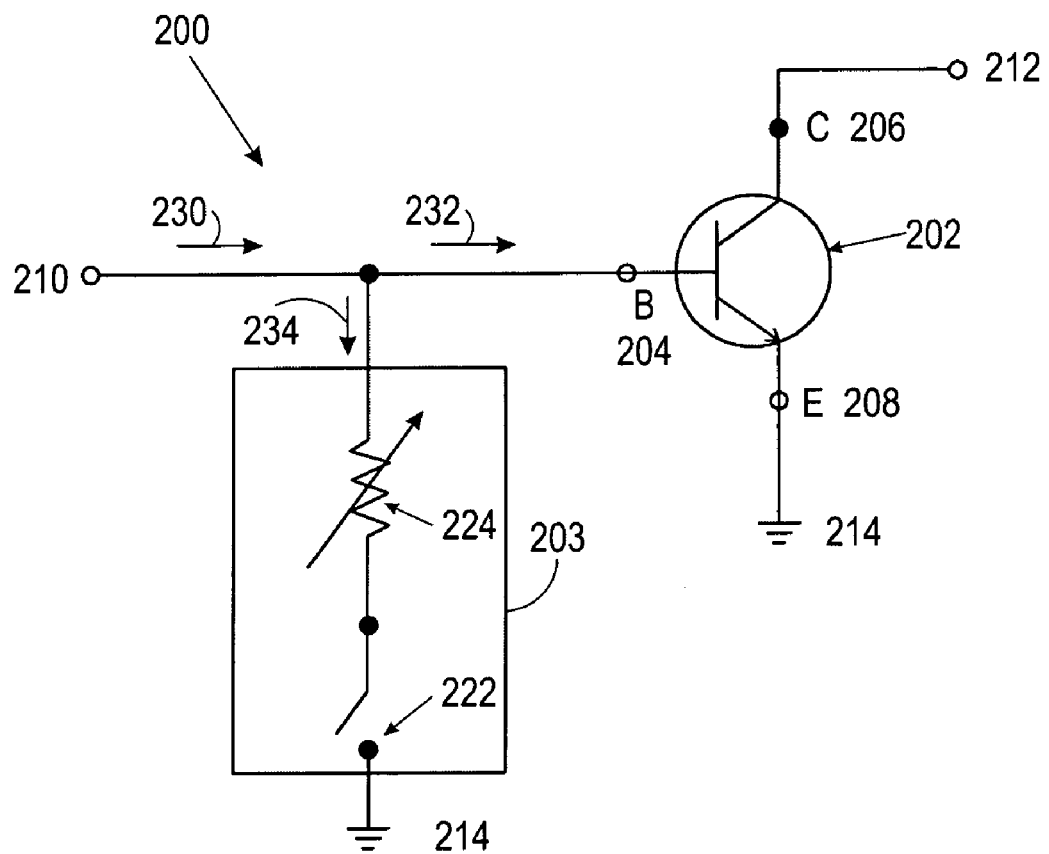
FIGS. 2A-C are schematic views depicting exemplary embodiments of the composite transistor circuit in a common emitter configuration, a common base configuration and a common collector configuration, respectively.
Figure 2B:
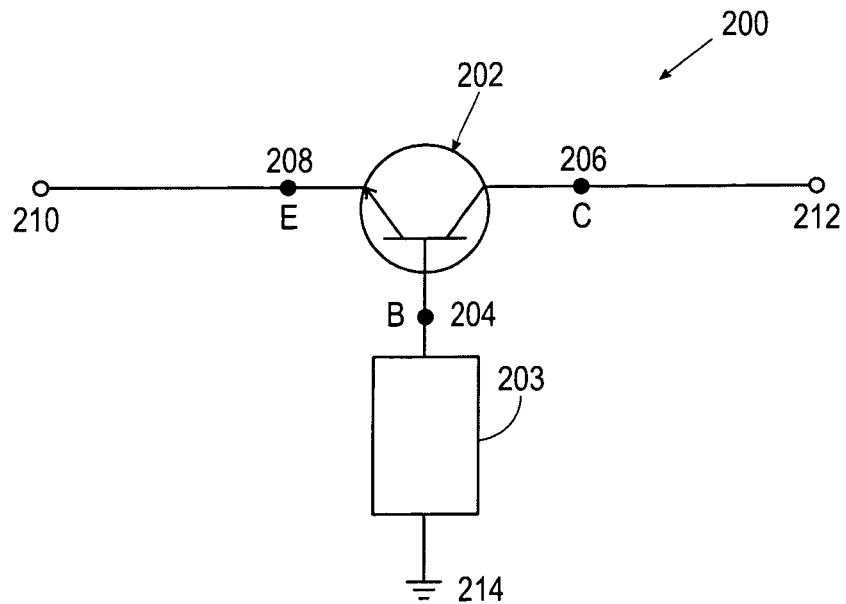
Figure 2C:
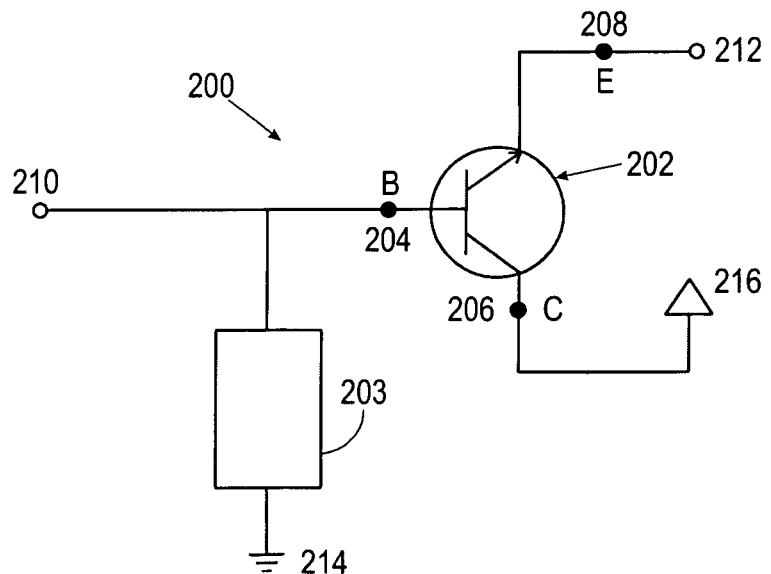

The systems and methods described herein provide for a composite transistor circuit having a bipolar transistor and a compensation unit configured to compensate for the self-heating effect and/or improve the linear performance of the bipolar transistor. FIG. 2A depicts an exemplary embodiment of the composite transistor circuit 200 having a bipolar transistor 202 and a compensation unit 203. The bipolar transistor 202 includes a base, a collector and an emitter coupled with nodes 204, 206 and 208, respectively. An input voltage for circuit 200 is measured between an input node 210 and a ground node 214 and the output voltage is measured between an output node 212 and the ground node 214. This embodiment of circuit 200 is in a common emitter configuration where the input voltage is the base-emitter voltage ($V_{BE}$) and the output voltage is the collector-emitter voltage ($V_{CE}$). The composite transistor circuit 200 can also be implemented in the common base and common collector configurations as depicted in FIGS. 2B and 2C, respectively. In FIG. 2C, the collector of the HBT 202 is coupled with a power supply 216.

Preferably, the bipolar transistor 202 is an HBT. As used herein, the term HBT refers to a heterojunction bipolar transistor where the emitter is preferably a wider band gap semiconductor than the base. For ease of illustration, the embodiments described herein will be described with reference to an HBT, although it should be understood that these embodiments can be used with any type of bipolar transistor. The self-heating effect is usually more apparent in semiconductor processes having a low thermal conductivity, which are typically used to fabricate HBTs as opposed to homojunction bipolar transistors. Use of the circuit 200 will increase the linear performance of any bipolar transistor, not only HBTs. Also, the bipolar transistor 202 can be doped as an NPN transistor (as shown) or a PNP transistor, or any variation thereof.

Here, the compensation unit 203 is configured to compensate for the self-heating effect in the HBT 202 and improve the linear performance of the HBT 202. Although only one HBT 202 is shown, the compensation unit 203 can be coupled with any number of HBTs 202. For instance, in some applications multiple HBTs 202 are coupled together in parallel and used to form a power cell. One composite transistor circuit 200 can be used to compensate for the self-heating effect and/or improve the linear performance of each HBT 202 in the power cell. During operation, the input current 230 is divided into currents 232 and 234, which are input to the HBT 202 and the compensation unit 203, respectively. Preferably, the compensation unit 203 is configured to decrease the amount of the current 234 it draws as $V_{CE}$ increases when the HBT 202 is in a constant current-driving mode where the input current 230 remains constant. In the constant current mode, the voltage measured between the base node 204 and the emitter node 208 ($V_{BE}$) decreases as $V_{CE}$ increases so that the HBT 202 can track the constant current input 232. As $V_{BE}$ decreases, the current 234 input to the compensation unit 203 also decreases. The current 232 input to the HBT 202 then increases in order to maintain input current 230 at a constant level. This increased base current 232 is preferably at a magnitude that compensates for the base current roll-off occurring as a result of the self-heating effect.

In this embodiment, the compensation unit 203 includes a non-linear resistor 224, the resistance of which is controlled by the output voltage $V_{CE}$, and an optional switch 222 controlled by the input current 230. The non-linear resistor 224 preferably controls the amount of current 234 to draw from the input node 210. When the base current 232 is low, the roll-off that occurs from the self-heating effect is minimal and the switch 222 is preferably open. When the base current 232 increases as the HBT enters a working current range, the switch 222 preferably closes and allows the non-linear resistor 224 to draw the appropriate amount of current 234 to offset the self-heating effect. Compensation for the self-heating effect also stabilizes the DC biasing point and improves the linear performance of the HBT 202. The non-linear characteristics of the resistor are preferably chosen to match the nonlinear characteristics of the HBT 202. The use of the compensation unit allows circuit 200 to be used as an almost ideal constant current source with adequate output resistance.

Figure 3A:
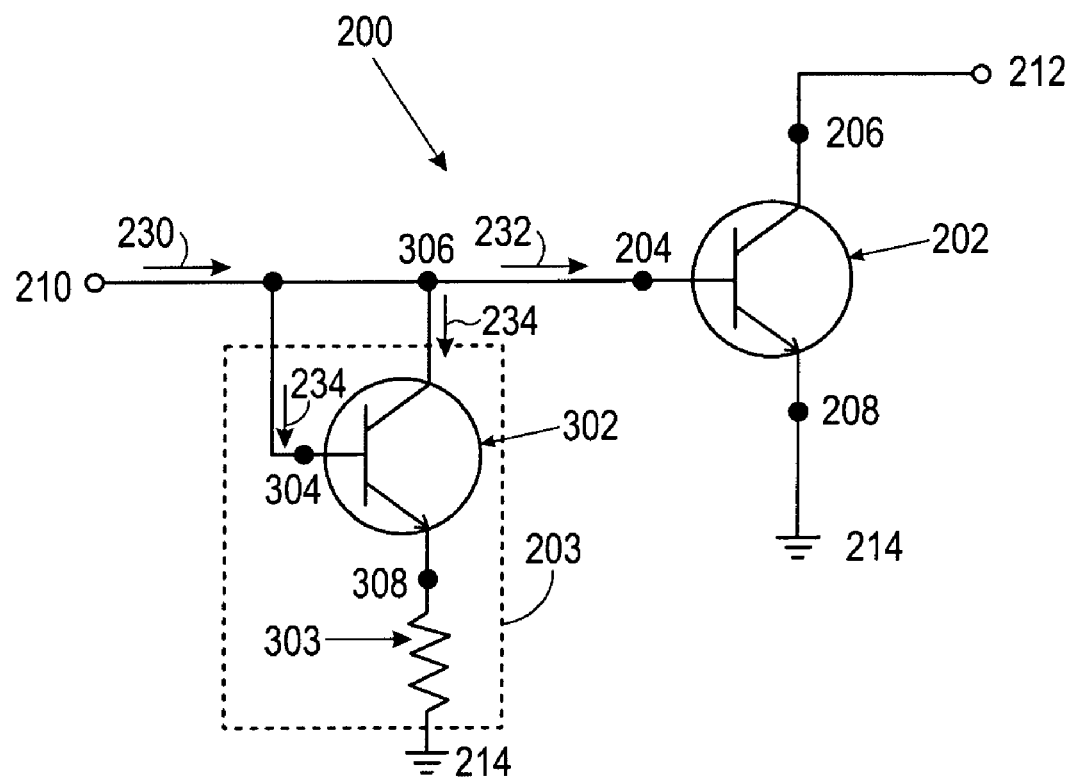
FIG. 3A is a schematic view depicting another exemplary embodiment of the composite transistor circuit.
Figure 4A:
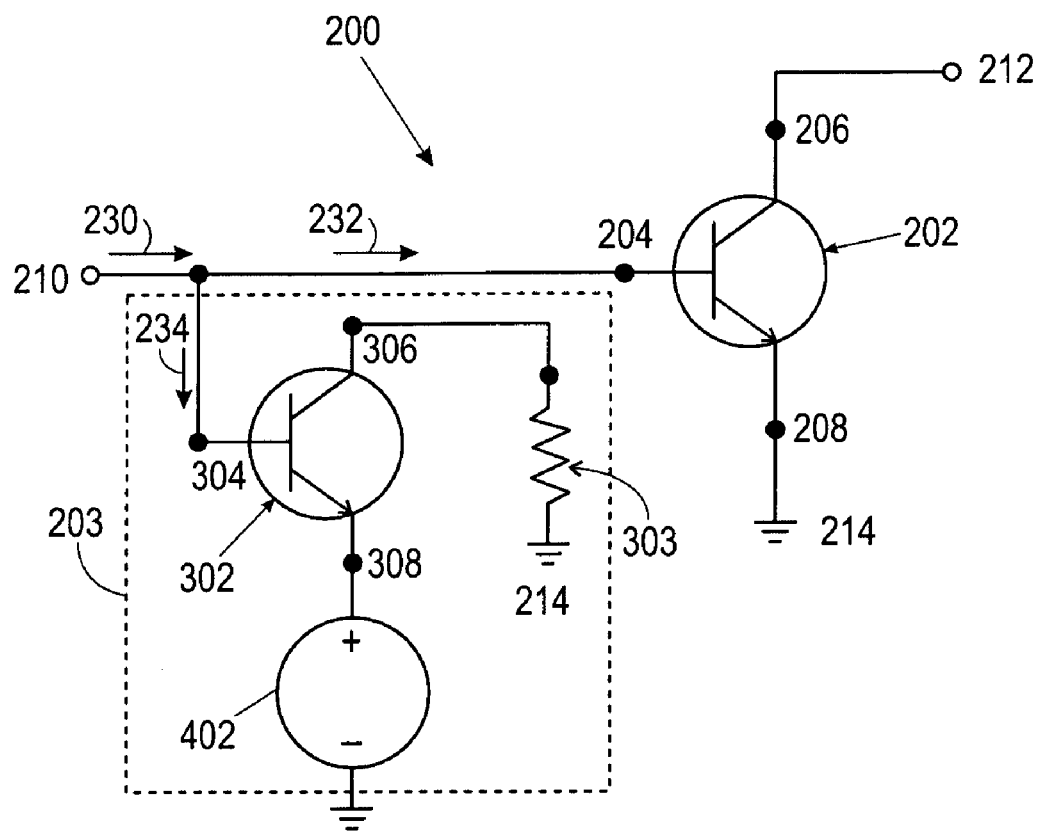
FIG. 4A is a schematic view depicting another exemplary embodiment of the composite transistor circuit.
Figure 5A:
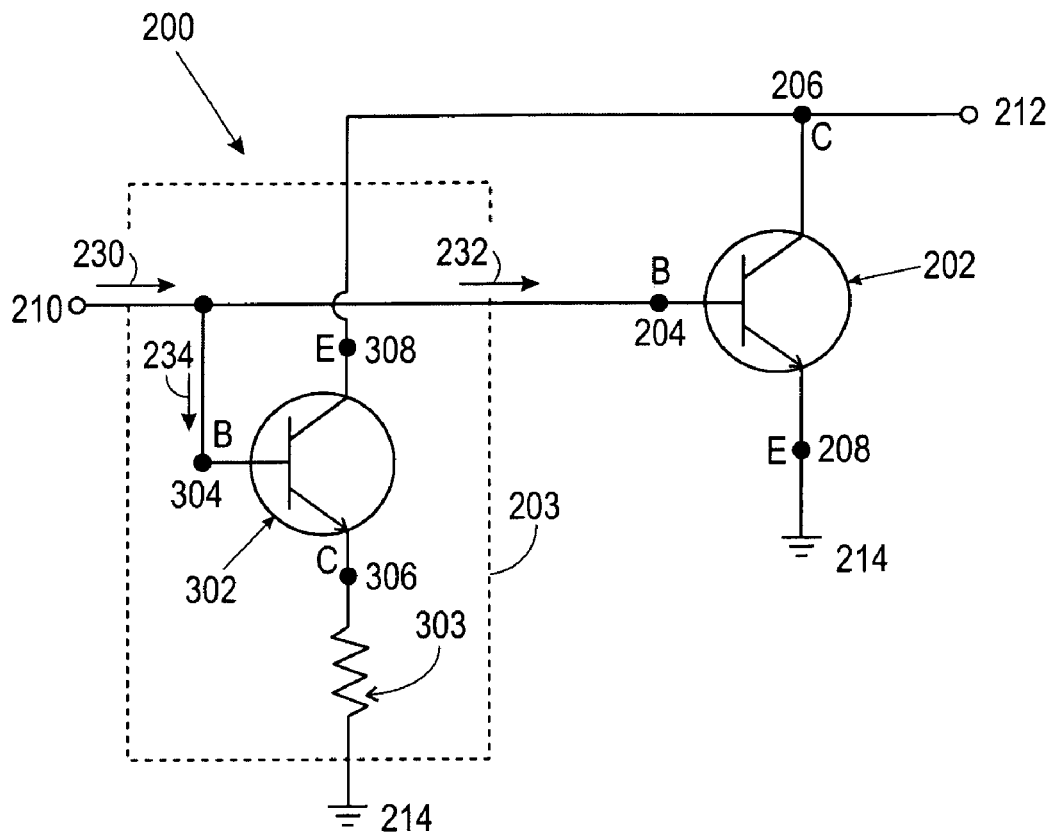
FIG. 5A is a schematic view depicting another exemplary embodiment of the composite transistor circuit.

The following alternative embodiments described with respect to FIGS. 3A, 4A and 5A use an active device to serve as the non-linear resistor 224 and the switch 222. FIG. 3A depicts another exemplary embodiment of the composite transistor circuit 200 where the compensation block includes a diode 302 in series with a resistor 303. Preferably, the diode 302 is an HBT having a base, a collector and an emitter coupled with nodes 304, 306 and 308, respectively. The base and collector of the HBT 302 are coupled together with the base of the HBT 202 and nodes 304, 306 and node 204 are at the same voltage during operation. The HBT 302 is preferably has similar characteristics as the HBT 202 so that the nonlinear performance of the HBT 302 can be used to compensate for and counteract the nonlinear performance of the HBT 202. The resistor 303, depicted in FIG. 2A, serves as a DC biasing resistor of the HBT 302 for determining the switch on or off state and by acting as a compensation controlling resistor of the HBT 202 used for determining the compensating strength. The resistance value (RES) of this resistor 303 can be optimized to provide the desired output current through output node 212 where compensation will begin, i.e., where the switch 222 will close. RES can also be optimized to provide the desired maximum compensated output current at node 212.

In this embodiment, there is a feedback loop for current compensation from the base of the HBT 302. As $V_{CE}$ for the HBT 202 increases, $V_{BE}$, which is the same for both the HBT 202 and the HBT 302, decreases. Because the HBT 202 is preferably operating in a constant-current driving mode, this in turn redistributes the allocation of currents 232 and 234 similar to that discussed above with respect to FIG. 2A. The current 234 to the HBT 302 decreases causing the base current 232 to increase, thereby compensating for the self-heating roll off. Although the gain decreases with the increasing $V_{CE}$ for the HBT 202, the collector current for the HBT 202 through the node 212 remains substantially constant due to the increase in the current 232.

Figure 3B:
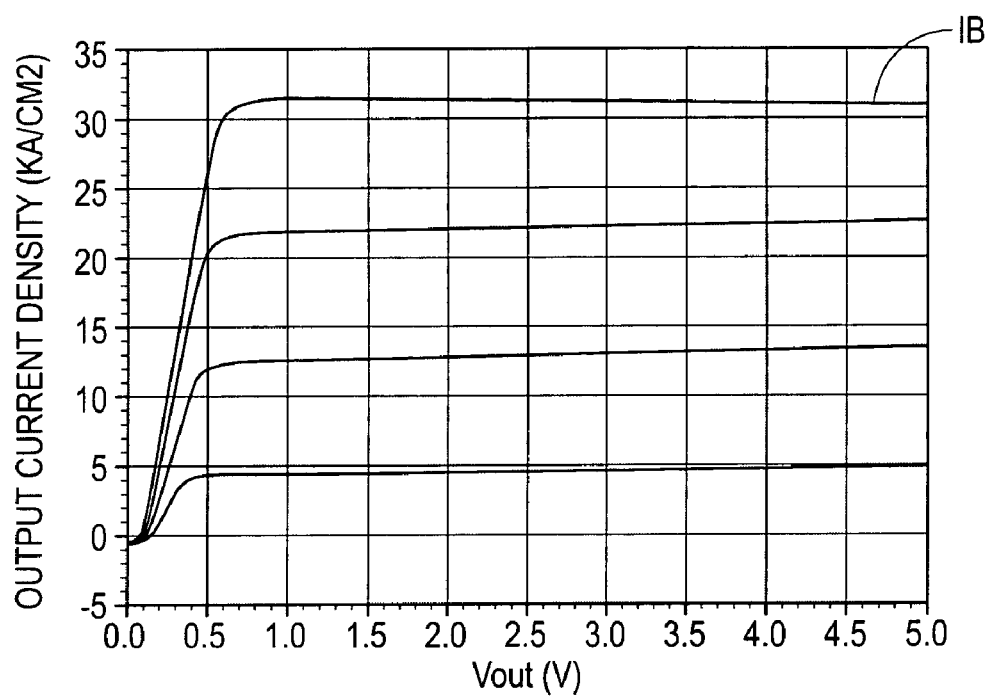
FIG. 3B is an exemplary graph of output current density versus output voltage for the exemplary embodiment depicted in FIG. 3A.

FIG. 3B is an exemplary graph of output current density versus the output voltage VCE for a simulation of the embodiment depicted in FIG. 3A. In this simulation, the compensation unit 203 was coupled with two HBTs 202, similar to a power cell, and used to compensate and improve the performance of both HBTs 202. Biasing of the base current for the HBT 202 is from 400 microamps (μA) to 1600 μA at 400 μA steps. The simulations described herein were performed at 50 degrees Centigrade with an Advanced Design System (ADS) simulator provided by Agilent Technologies. FIG. 3B shows that this embodiment can compensate for the self-heating effect and improve the linear performance of the HBT 202, as compared to the performance of conventional HBTs such as that depicted in FIG. 1A. The DC biasing point experiences minimal disturbance from the variation of $V_{CE}$, which improves the stability and linearity of circuit 200.

FIG. 4A depicts another exemplary embodiment of the composite transistor circuit 200 where the compensation block includes an HBT 302 having a base, collector and emitter coupled with nodes 304, 306 and 308, respectively. Here, the base of the HBT 302 is coupled together with the base of the HBT 202 and nodes 304 and node 204 are at the same voltage during operation. The collector of the HBT 302 is coupled with the resistor 303, which again serves as a DC biasing resistor of the HBT 302 for determining the switch on or off state and by acting as a compensation controlling resistor of the HBT 202 used for determining the compensating strength. The emitter of the HBT 302 is coupled with a DC voltage source 402. The operation of this embodiment is similar to that described above with respect to FIG. 3A. There is a feedback loop for current compensation from the base of the HBT 302. As $V_{CE}$ for the HBT 202 increases, $V_{BE}$ decreases. Because the HBT 202 is preferably operating in a constant-current driving mode, this in turn redistributes the allocation of currents 232 and 234 similar to that discussed above with respect to FIG. 2A. The base current 234 decreases causing the base current 232 to increase, thereby compensating for the self-heating roll off.

Figure 4B:
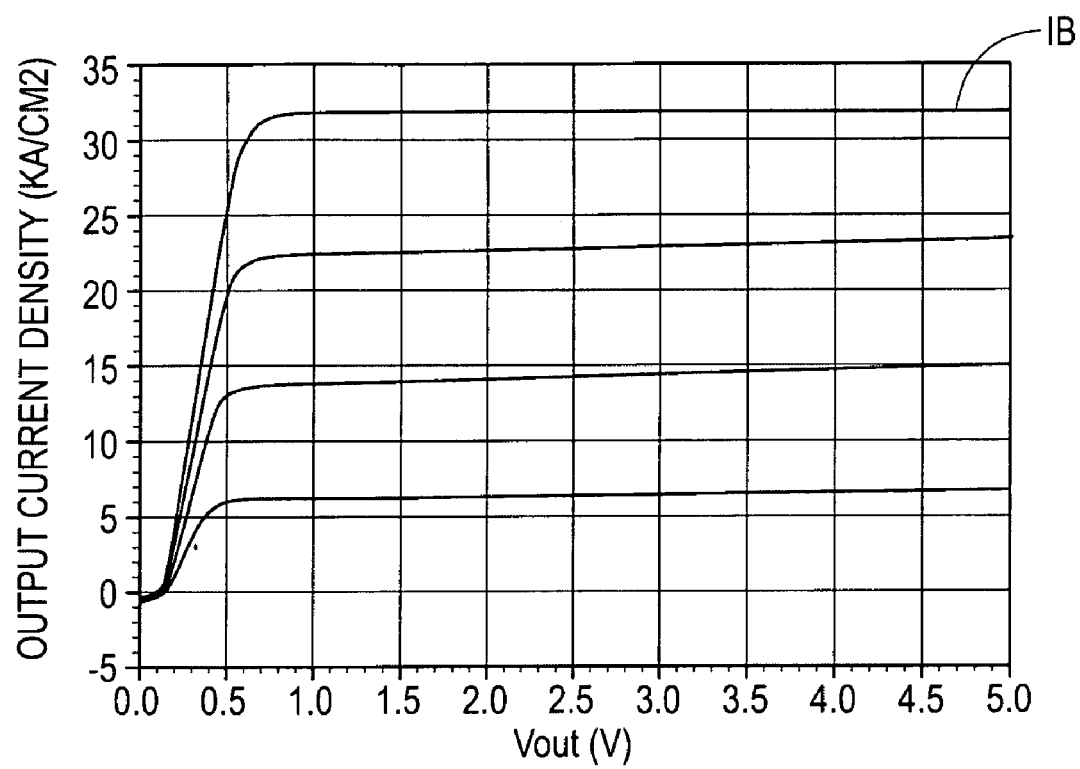
FIG. 4B is an exemplary graph of output current density versus output voltage for the exemplary embodiment depicted in FIG. 4A.

FIG. 4B is an exemplary graph of output current density versus the output voltage VCE for a simulation of the embodiment depicted in FIG. 4A. In this simulation, the compensation unit 203 was coupled with two HBTs 202 and used to compensate both. Biasing of the base current for the HBT 302 is from 800 μA to 2000 μA at 400 μA steps. The simulation was performed at 50 degrees Centigrade with an ADS simulator provided by Agilent Technologies and shows that this embodiment can compensate for the self-heating effect and improve the linear performance of the HBT 202, as compared to the performance of conventional HBTs such as that depicted in FIG. 1A.

FIG. 5A depicts another exemplary embodiment of the composite transistor circuit 200 where the compensation block includes an HBT 302 having a base, collector and emitter coupled with nodes 304, 306 and 308, respectively. Here, the base of the HBT 302 is coupled together with the base of the HBT 202 and nodes 304 and node 204 are at the same voltage during operation. The collector of the HBT 302 is coupled with the resistor 303, which again serves as a DC biasing resistor of the HBT 302 for determining the switch on or off state and by acting as a compensation controlling resistor of the HBT 202 used for determining the compensating strength. The emitter of the HBT 302 is coupled with the collector of the HBT 202 and nodes 206, 306 and 212 are at the same voltage during operation. The operation of this embodiment is again similar to that described above with respect to FIG. 3A. There is a feedback loop for current compensation from the base of the HBT 302. As $V_{CE}$ for the HBT 202 increases, $V_{BE}$ decreases. Because the HBT 202 is preferably operating in a constant-current driving mode, this in turn redistributes the allocation of currents 232 and 234 similar to that discussed above with respect to FIG. 2A. The base current 234 decreases causing the base current 232 to increase, thereby compensating for the self-heating roll off.

Figure 5B:
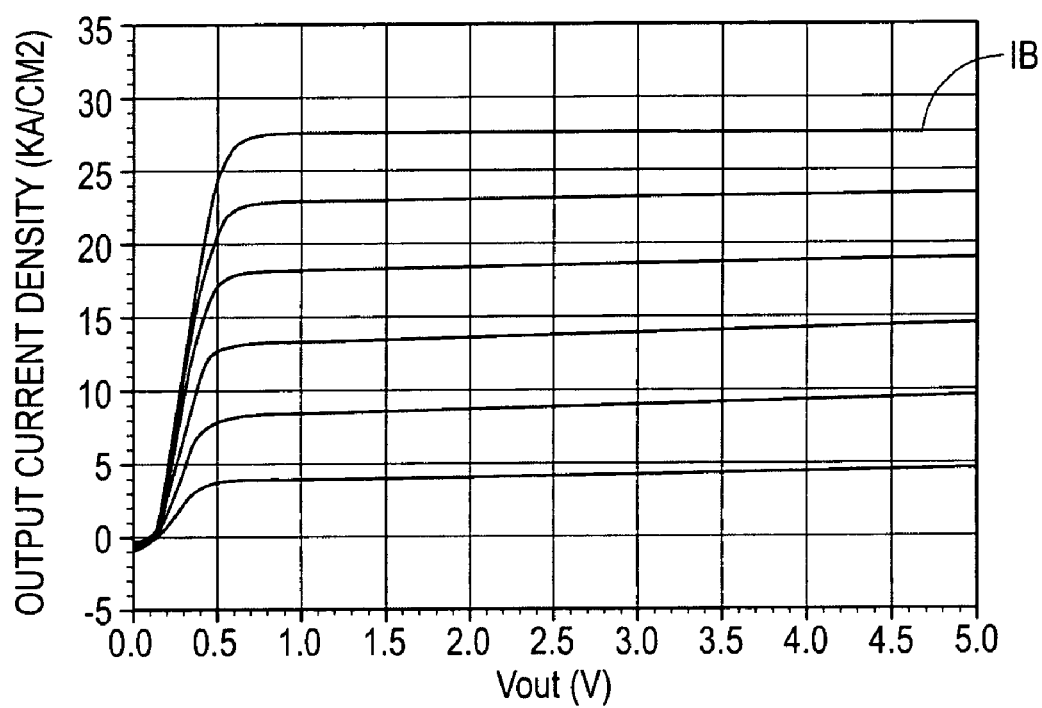
FIG. 5B is an exemplary graph of output current density versus output voltage for the exemplary embodiment depicted in FIG. 5A.

FIG. 5B is an exemplary graph of output current density versus the output voltage VCE for a simulation of the embodiment depicted in FIG. 5A. In this simulation, the compensation unit 203 was coupled with two HBTs 202 and used to compensate both, similar to the configuration of a power cell. Biasing of the base current for the HBT 302 is from 600 μA to 1600 μA at 200 μA steps. The simulation was performed at 50 degrees Centigrade with an ADS simulator provided by Agilent Technologies and shows that this embodiment can compensate for the self-heating effect and improve the linear performance of the HBT 202, as compared to the performance of conventional HBTs such as that depicted in FIG. 1A.

The value of the resistance RES of the resistor 303 can be determined in the following manner. As described above, the output current at node 212 will decrease with an increasing output voltage. To keep the output current constant, the base input current 232 to the HBT 202 ($I_{B1}$) should be increased by an amount $\Delta I_{B1}$. The input voltage ($V_{BE1}$) of the HBT 202 is a function of IB1 and the output voltage for a common emitter configuration ($V_{CE}$) as shown in (1):

$$V_{BE1} = f(I_{B1}, V_{CE}) \tag{1}$$

From (1), we can derive (2):

$$dV_{BE1} = \frac{\partial f}{\partial I_{B1}} \cdot dI_{B1} + \frac{\partial f}{\partial V_{CE}} \cdot dV_{CE} \tag{2}$$

And $$dV_{BE1} = \frac{\partial f}{\partial I_{B2}} \cdot dI_{B2} + RES \cdot dI_{C2} \tag{3}$$

where $I_{B2}$ is the base current 234 of the HBT 302, and $I_{C2}$ is the collector current of the HBT 302.

Since the collector-emitter voltage across the HBT 302 does not change significantly during variation in the base currents $I_{B1}$ and $I_{B2}$, the voltage across the resistor 303 will account for a substantial part of the voltage drop in the compensation unit 203 as the output voltage $V_{CE}$ increases. Since the value of $dI_{B1}$ ($\Delta I_{B1}$) is close to that of $dI_{C2}$, the value of degenerate resistor can be calculated with the equation (4).

$$RES \approx \frac{\Delta V_{BE1}}{\Delta I_{B1}} \tag{4}$$

As one of skill in the art will readily recognize, the value of RES is dependent on the individual application and configuration of circuit 200. The value of RES can be that described in (4) or a different value based on the needs of the application. Equation (4) is applicable to each of the embodiments described with respect to FIGS. 2-5B and can serve as a basis or starting point for design and simulation of circuit 200. The value of RES should be changed accordingly if the circuit 200 is implemented in a common base or common collector configuration. In one alternate embodiment, the resistor 303 is implemented as a thin-film transistor (TFT).

Tables 1 and 2 include the normalized results of a simulation of the output current $I_{C1}$ for the embodiments of circuit 200 described with respect to FIGS. 3A, 4A and 5A. The results in Table 1 show that each of the three embodiments are robust across varying values of RES and that $I_{C1}$ varies minimally between embodiments for different values of RES. Table 2 further demonstrates the robustness of the various embodiments as the transport saturation current ($I_S$) is varied. The results in Table 2 also include simulation results for a conventional HBT. It can be seen here that $I_{C1}$ for the embodiments of circuit 200 remains very similar to that of the conventional HBT across as $I_S$ is varied.

Figure 8A:
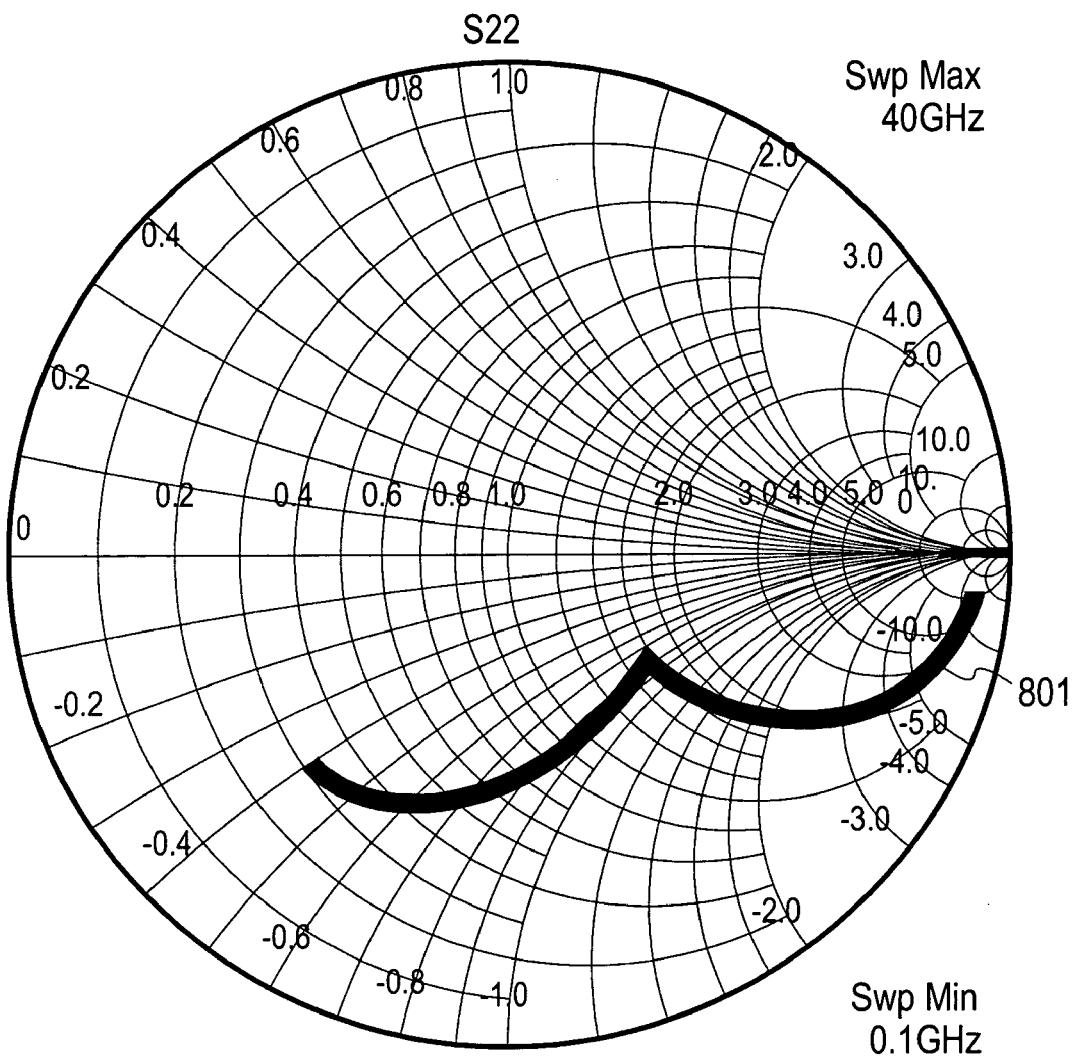
FIGS. 8A-B are exemplary graphs depicting the magnitude of the S parameter $S_{22}$ for the conventional HBT and the embodiment described with respect to FIG. 5A, respectively.
Figure 8B:
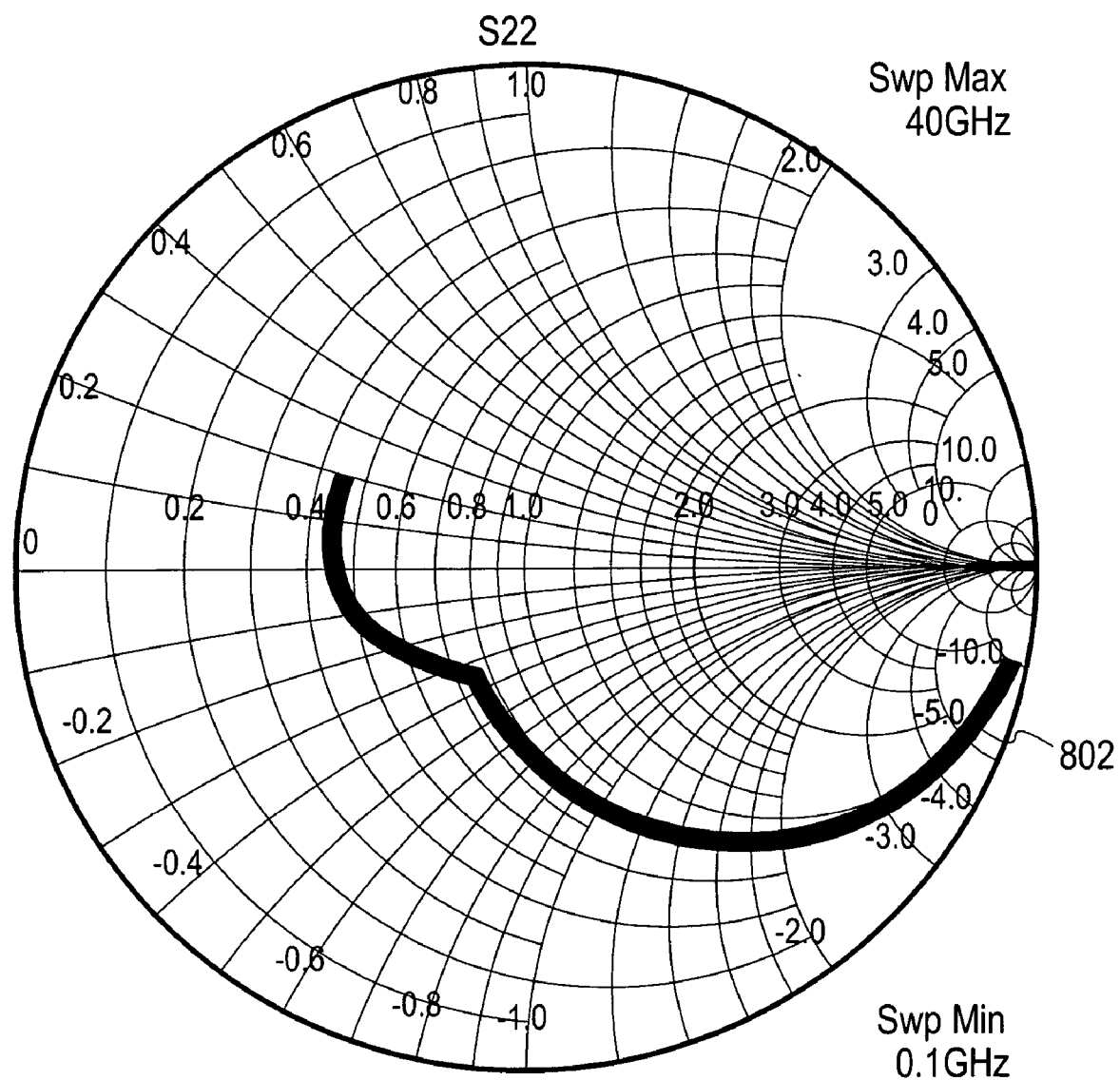

7A-B both show the improved $S_{21}$ performance of the embodiments described with respect to FIGS. 3A, 4A and 5A as compared to the conventional HBT. FIGS. 8A-B are additional graphs depicting exemplary simulation results of the magnitude of the S parameter $S_{22}$ for the conventional HBT and the embodiment described with respect to FIG. 5A, respectively. FIGS. 8A-B show that the $S_{22}$ performance of the embodiment described with respect to FIG. 5A is improved in comparison to the conventional HBT. The angle of the turning points in the $S_{22}$ curves depicted in FIG. 8A are greater than those of FIG. 8B, i.e., the real part of $S_{22}$ does not change much for the embodiment described with respect to FIG. 5A as compared to the conventional HBT. This is because the equivalent miller capacitance between the base and collector of the HBT 202 ($C_{BC}$) in the embodiment described with respect to FIG. 5A is altered by addition of the compensation unit 203. Similar results were also obtained from the embodiments described with respect to FIGS. 3A and 4A. Accordingly, the design and implementation of a matching circuit for the output stage coupled with output port 212 is made much easier for circuit 200 than for conventional circuits.

TABLE 1

| RES | 0.5 | 0.6 | 0.7 | 0.8 | 0.9 | 1.0 | 1.1 | 1.2 | 1.3 | 1.4 | 1.5 |
|---|---|---|---|---|---|---|---|---|---|---|---|
| FIG. 3A | 0.745 | 0.818 | 0.878 | 0.926 | 0.966 | 1 | 1.03 | 1.06 | 1.08 | 1.10 | 1.12 |
| FIG. 4A | 0.674 | 0.764 | 0.837 | 0.900 | 0.953 | 1 | 1.039 | 1.075 | 1.106 | 1.134 | 1.159 |
| FIG. 5A | 0.696 | 0.781 | 0.851 | 0.909 | 0.957 | 1 | 1.035 | 1.066 | 1.093 | 1.118 | 1.140 |

TABLE 2

| $I_S$ | 0.5 | 0.6 | 0.7 | 0.8 | 0.9 | 1.0 | 1.1 | 1.2 | 1.3 | 1.4 | 1.5 |
|---|---|---|---|---|---|---|---|---|---|---|---|
| Conven. | 0.561 | 0.657 | 0.749 | 0.837 | 0.921 | 1 | 1.078 | 1.151 | 1.225 | 1.294 | 1.361 |
| FIG. 3A | 0.599 | 0.689 | 0.776 | 0.854 | 0.930 | 1 | 1.068 | 1.132 | 1.194 | 1.253 | 1.310 |
| FIG. 4A | 0.562 | 0.658 | 0.749 | 0.837 | 0.921 | 1 | 1.079 | 1.153 | 1.226 | 1.297 | 1.365 |
| FIG. 5A | 0.560 | 0.655 | 0.747 | 0.834 | 0.919 | 1 | 1.079 | 1.155 | 1.228 | 1.300 | 1.369 |

Figure 6:
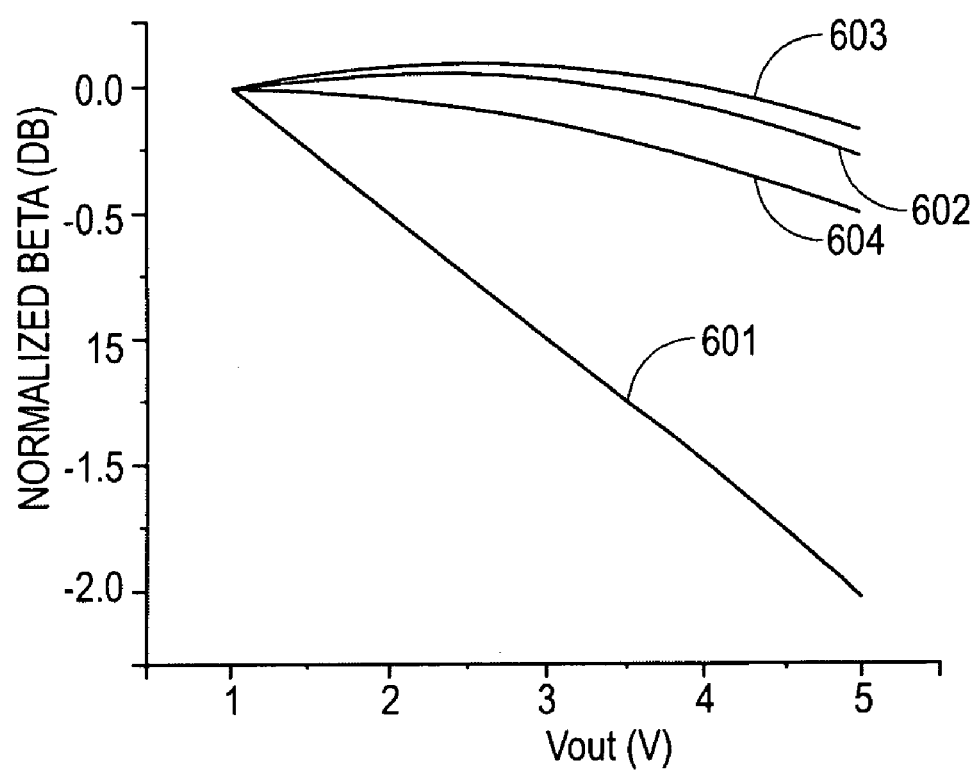
FIG. 6 is an exemplary graph of normalized gain versus output voltage for a conventional HBT and the embodiments described with respect to FIGS. 3A, 4A and 5A.

FIG. 6 is a graph depicting normalized β versus $V_{CE}$ for simulations of a conventional HBT (curve 601) and the embodiments described with respect to FIG. 3A (curve 602), FIG. 4A (curve 603) and FIG. 5A (curve 604) while operating in the active region. The normalized β value is derived from $20*\log(\beta/\beta_o)$, where $\beta_o$ is the value of β at $V_{CE}$ equal to one volt and the output current density at approximately 30 kA/cm². FIG. 6 illustrates that the embodiments described with respect to FIGS. 3A, 4A and 5A substantially compensate for the self-heating effect as compared to the conventional HBT since the degree to which β decreases with increasing $V_{CE}$ is much reduced. As a result, the linear performance of these embodiments is significantly improved.

Figure 7A:
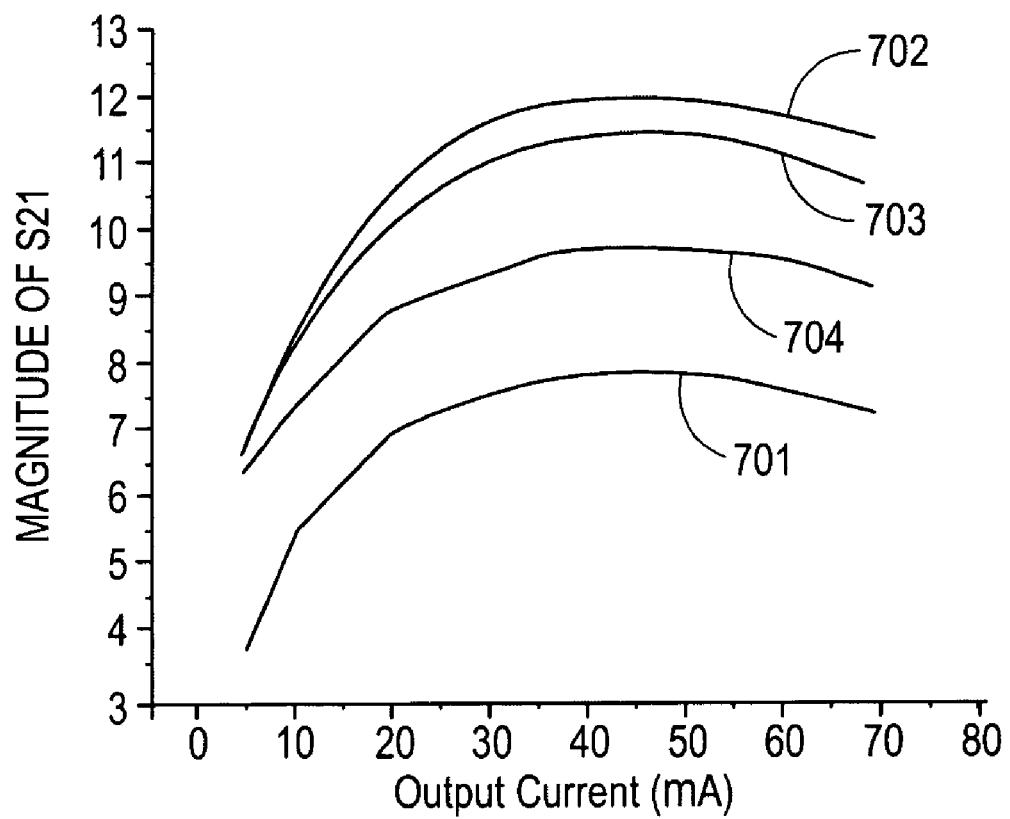
FIGS. 7A-B are exemplary graphs depicting the magnitude of the S parameter $S_{21}$ versus the output current for the conventional HBT and the embodiments described with respect to FIGS. 3A, 4A and 5A at 0.9 Gigahertz (Ghz) and 1.8 Ghz, respectively.
Figure 7B:
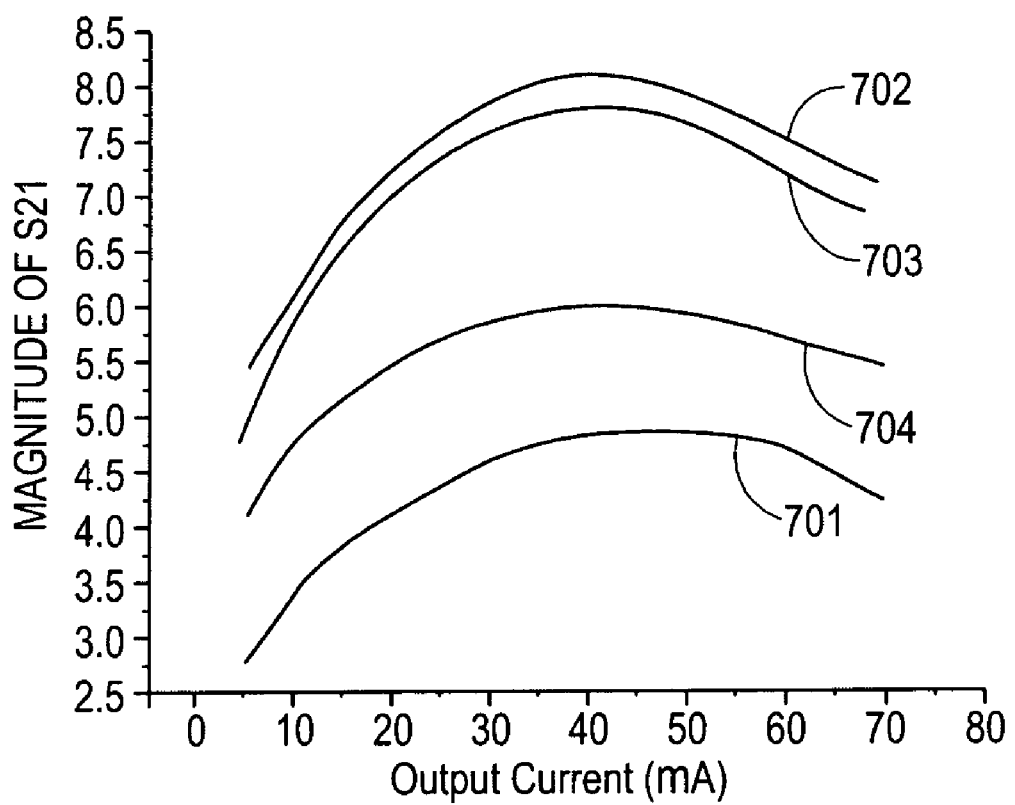

The composite transistor circuit 200 also facilitates matching of the input port 210 and output port 212 for RF applications, as compared to the conventional HBT. For instance, FIGS. 7A-B are graphs depicting exemplary simulation results of the magnitude of the S parameter $S_{21}$ versus the output current through output port 212 for the conventional HBT (curve 701) and the embodiments described with respect to FIG. 3A (curve 702), FIG. 4A (curve 703) and FIG. 5A (curve 704) at 0.9 Ghz and 1.8 Ghz, respectively. FIGS.

Figure 1A:
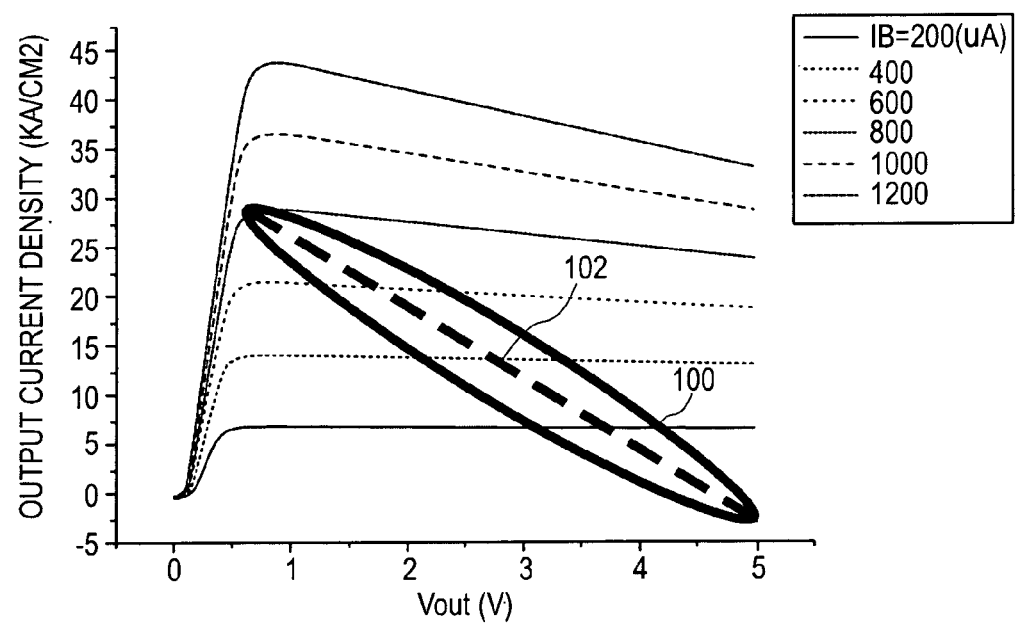
FIGS. 1A-B are exemplary graphs of output current density versus output voltage for a conventional HBT and an ideal HBT, respectively.
Figure 1B:
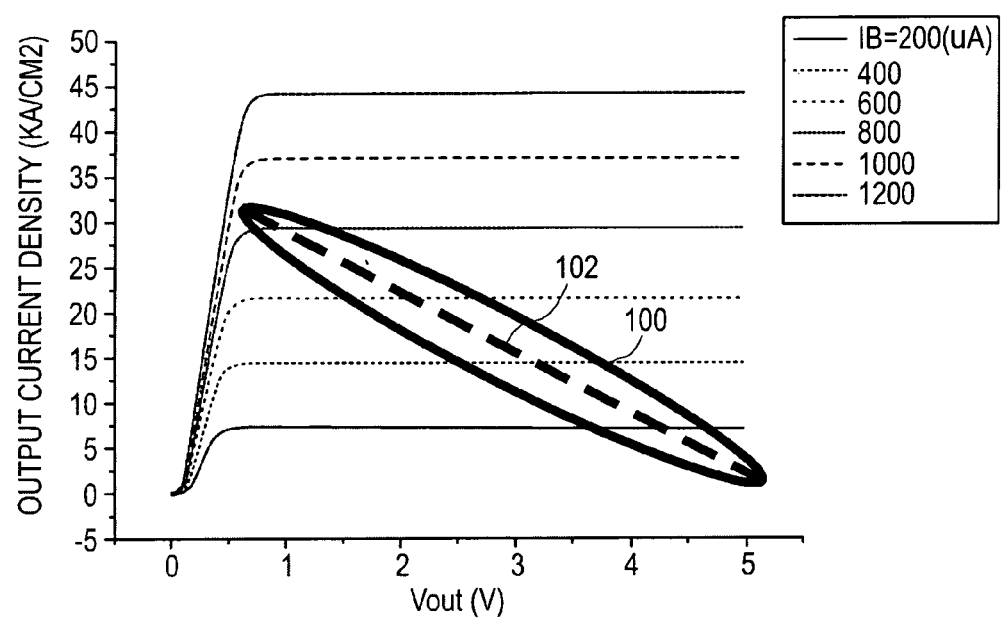

As depicted in FIGS. 1A-B, the load line 100 of an HBT used in certain applications, such as a power amplifier, takes a generally elliptical form as opposed to a straight line 102 because of the charging and discharging process taking place between the HBT and its reactive part of the load. In a power amplifier, the nonlinear effect becomes readily apparent when the input power drives the HBT into the saturation region and the cutoff region. Before the HBT enters the saturation or cutoff region, the major source of nonlinearity derives from this generally elliptical region 100 forming the load line. If the self-heating effect is compensated, the linearity of the circuit can be increased as well.

To compare the linearity of the composite transistors, an exemplary P1 dB simulation was performed for the conventional HBT and the embodiments described with respect to FIGS. 3A, 4A and 5A. The P1 dB results are included in Table 3 along with the resulting efficiency. Each circuit was simulated at 0.9 Ghz with the same DC biasing point and a similar matching circuit. An optimum load impedance for DC biasing for class A mode operation of 108 Ohms (Ω) was used. From Table 3, it is can be seen that the P1 dB point and efficiency are increased in the embodiments described with respect to FIGS.

3A, 4A and 5A as compared to the conventional HBT. The power gain of all four circuits was around 23 dB.

TABLE 3

|  | Conven. | FIG. 3A | FIG. 4A | FIG. 5A |
|---|---|---|---|---|
| P1dB (dBm) | 15.3 | 16.1 | 16.2 | 17.1 |
| Efficiency (%) | 32 | 40 | 38 | 48 |

The self-heating effect is most pronounced in fabrication processes having a relatively low thermal conductivity as compared to a silicon-only process. Some examples of processes that have relatively low thermal conductivities are GaAs, InP and GaN. Circuit 200 is preferably implemented in any of these processes or any other relatively low thermal conductivity process.

Figure 9:
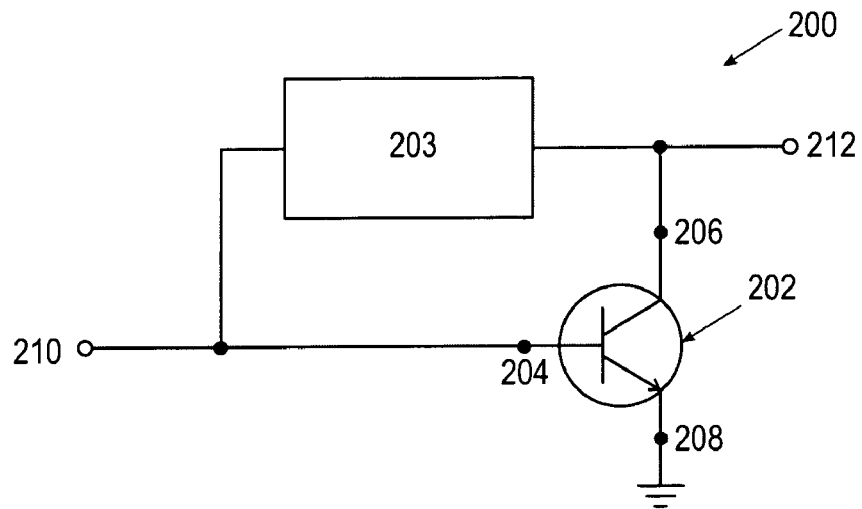
FIG. 9 is a schematic view depicting another exemplary embodiment of the composite transistor circuit.

FIG. 9 depicts another exemplary embodiment of the composite transistor circuit 200 where the compensation unit is coupled between the base and the collector of the HBT 202. In this embodiment, the compensation unit improves the linear performance by stabilizing the DC biasing point of the HBT 202. The compensation unit 203 acts in a feedback capacity as a large feedback resistor between the collector and base of the HBT 202. As the $V_{CE}$ to the HBT 202 increases, the DC biasing voltage component at the input node 210 generally decreases, in turn decreasing the output current at node 212. But as the $V_{CE}$ of the HBT 202 increases, the feedback current through the compensation unit 203 increases, and both the base input current to the HBT 202 and the input voltage at node 210 increases, which compensates for the drop off in the output current through node 212 and the input voltage $V_{BE}$ of the HBT 202. Inclusion of the compensation unit 203 creates a feedback loop which can stabilize the DC component of the input voltage. Because the nonlinear transconductance of the HBT 202 is a function of the input voltage, the compensation unit 203 stabilizes the transconductance. The compensation unit 203 also makes the miller capacitance $C_{BC}$ of the HBT 202 more independent of the output voltage $V_{CE}$. Hence, the compensation unit 203 stabilizes the DC biasing point ($V_{BE}$) and improves the linear performance of the HBT 202.

Figure 10:
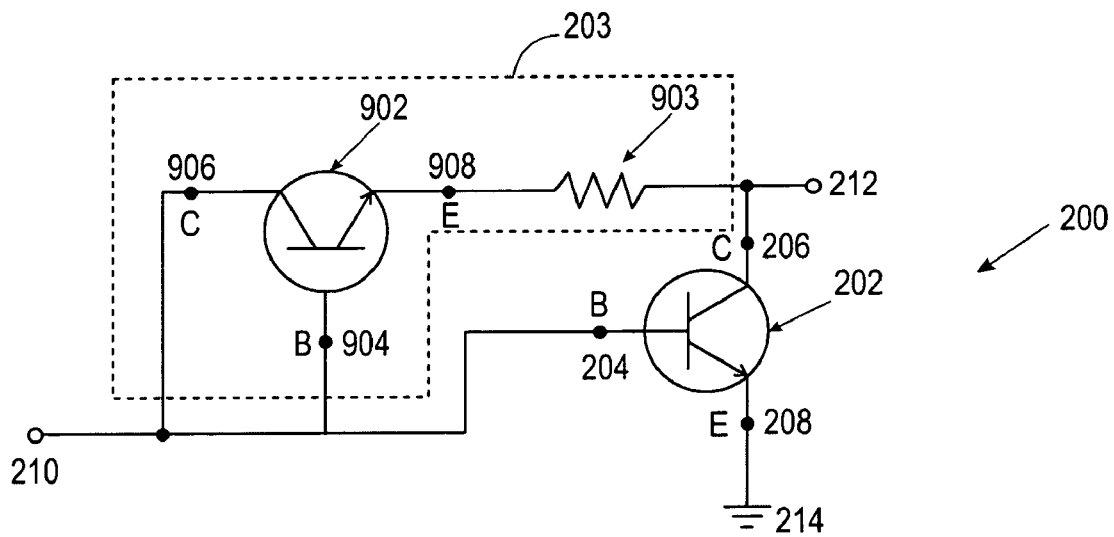
FIG. 10 is a schematic view depicting another exemplary embodiment of the composite transistor circuit.

FIG. 10 depicts another exemplary embodiment of the composite transistor circuit 200 where the compensation unit 203 is an inverted diode 902 in series with a resistor 903. In this embodiment, the diode 902 is an HBT having a base, collector and emitter coupled with nodes 904, 906 and 908, respectively, where the base and collector are coupled together with the base of the HBT 202 such that the voltage at nodes 204, 904 and 906 are substantially the same during operation. The resistance value RES2 of the resistor 903 is preferably selected so as not to effect the gain of the HBT 202 based on the working frequency and the linearizing power level, i.e., the load impedance generally changes with the power level, so the resistance value RES2 of the resistor 903 is preferably adjusted accordingly to prevent the overall power gain of the circuit 200 from being changed significantly.

The linear performance of the conventional HBT and the embodiments described with respect to FIGS. 3A, 4A, 5A and 10 are compared in Table 4. Table 4 shows exemplary results from a simulation of P1 dB and efficiency. Here, it can be seen that each of the embodiments provides improved linear performance as compared to the conventional HBT.

TABLE 4

|  | Conven. | FIG. 3A | FIG. 4A | FIG. 5A | FIG. 10 |
|---|---|---|---|---|---|
| P1dB (dBm) | 15.3 | 16.1 | 16.2 | 17.1 | 16.8 |
| Efficiency (%) | 32 | 40 | 38 | 48 | 41 |

Although the embodiment described with respect to FIGS. 9-10 can be implemented in any semiconductor process, it should be noted that certain processing parameters may need to be adjusted in order to provide the proper operation. For instance, in a SiGe process, the breakdown voltage for the base-emitter junction is typically on the order of 2 volts. This voltage should be increased to allow for the wide variation in the output voltage $V_{CE}$.

The embodiments described herein allow compensation for the self-heating effect and improvement in the linear performance of the HBT 202 in large signal applications without alteration to the processing technology and without compromising power gain, power efficiency or chip area. These embodiments can be used as an alternative to a linearizer. Also, because a single compensation unit 203 can be used to enhance the performance of any number of HBTs 202, overall chip area is minimally effected. For instance, one compensation unit 203 can be coupled with 8 power cells in a power amplifier. Since the chip area of the compensation unit 203 is comparable to that of an individual power cells, the chip area is increased only increased by slightly greater than 10%.

The composite transistor circuit 200 is discussed in detail in Huai Gao et al., "A Compact Composite Transistor as a Novel RF Power Cell for High Linearity Power Amplifiers," IEEE Microwave and Optical Technology Letters, June 2005 and Huai Gao et al., "A Novel Compact Composite Power Cell for High Linearity Power Amplifiers in InGaP HBTs," 2004 Compound Semiconductor IC Symposium, pp. 45-48, 2004, both of which are fully incorporated by reference herein.

In the foregoing specification, the invention has been described with reference to specific embodiments thereof. It will, however, be evident that various modifications and changes may be made thereto without departing from the broader spirit and scope of the invention. For example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. A composite transistor circuit, comprising
   a bipolar transistor having a base, an emitter and a collector; and
   a compensation unit coupled with the bipolar transistor and configured to stabilize the biasing point of the bipolar transistor, wherein the compensation unit comprises a nonlinear resistor coupled in series with a switch, and wherein the nonlinear resistor is an active device.

2. A composite transistor circuit, comprising
   a bipolar transistor having a base, an emitter and a collector; and
   a compensation unit coupled with the bipolar transistor and configured to stabilize the biasing point of the bipolar transistor, wherein the compensation unit comprises a diode in series with a resistor, wherein the diode comprises a second bipolar transistor configured as the diode, and wherein the diode has a diode input and a diode output and the resistor has a resistor input and a resistor output, the diode input being coupled with the base, the diode output being coupled with the resistor input and the resistor output being coupled with the collector.

3. A composite transistor circuit, comprising a bipolar transistor having a base, an emitter and a collector; and a compensation unit coupled with the bipolar transistor and configured to stabilize the biasing point of the bipolar transistor, wherein the bipolar transistor is a first bipolar transistor, the base is a first base, the collector is a first collector and the emitter is a first emitter, and wherein the compensation unit comprises a second bipolar transistor having a second base, a second collector and a second emitter, the first base being coupled with the second base, the second collector being coupled with a first resistor node of a resistor configured to resist current between the first resistor node and a second resistor node, the second resistor node being coupled with a ground voltage node, and the second emitter being coupled with a direct current (DC) voltage source.

4. A composite transistor circuit, comprising a bipolar transistor having a base, an emitter and a collector; and a compensation unit coupled with the bipolar transistor and configured to stabilize the biasing point of the bipolar transistor, wherein the bipolar transistor has a base-collector capacitance ($C_{BC}$) and the compensation unit is configured to decrease the dependence of the base-collector capacitance on the output voltage.

* * * * *